United States Patent
Ravanan

(10) Patent No.: US 11,863,089 B2
(45) Date of Patent: Jan. 2, 2024

(54) LIVE MEASUREMENT OF HIGH VOLTAGE POWER SUPPLY OUTPUT

(71) Applicant: Applied Materials, Inc., Santa Clara, CA (US)

(72) Inventor: Prakash Ravanan, Srirangam (IN)

(73) Assignee: Applied Materials, Inc., Santa Clara, CA (US)

( * ) Notice: Subject to any disclaimer, the term of this patent is extended or adjusted under 35 U.S.C. 154(b) by 512 days.

(21) Appl. No.: 17/213,894

(22) Filed: Mar. 26, 2021

(65) Prior Publication Data

US 2022/0311361 A1   Sep. 29, 2022

(51) Int. Cl.
*H02N 13/00* (2006.01)
*B06B 1/02* (2006.01)

(52) U.S. Cl.
CPC ........... *H02N 13/00* (2013.01); *B06B 1/0292* (2013.01)

(58) Field of Classification Search
CPC .......... H01L 21/67253; H01L 21/6833; B06B 1/0292; H02N 13/00
USPC ...................................................... 361/234
See application file for complete search history.

(56) References Cited

U.S. PATENT DOCUMENTS

| | | | |
|---|---|---|---|
| 5,737,177 A * | 4/1998 | Mett | H01L 21/6833 279/128 |
| 6,095,084 A | 8/2000 | Shamouilian et al. | |
| 7,837,828 B2 | 11/2010 | Ikeda et al. | |
| 7,883,632 B2 | 2/2011 | Honda et al. | |
| 2003/0085205 A1 | 5/2003 | Lai et al. | |
| 2010/0252417 A1* | 10/2010 | Allen | C23C 14/345 204/192.12 |
| 2015/0123541 A1 | 5/2015 | Baek et al. | |
| 2020/0036367 A1* | 1/2020 | Slobodov | H01J 37/32128 |

FOREIGN PATENT DOCUMENTS

WO   2019204736 A1   10/2019

* cited by examiner

*Primary Examiner* — Kevin J Comber
(74) *Attorney, Agent, or Firm* — Servilla Whitney LLC

(57) ABSTRACT

Process chamber, high voltage measurement systems and methods for monitoring the output of a high voltage power supply are described. The output of the high voltage power supply is converted using a transducer and measured with high accuracy. A high voltage measurement system compares the converted value with a threshold criterion and actuates an interlock if readings are outside the threshold.

17 Claims, 1 Drawing Sheet

US 11,863,089 B2

1

LIVE MEASUREMENT OF HIGH VOLTAGE POWER SUPPLY OUTPUT

TECHNICAL FIELD

Embodiments of the disclosure generally relate to methods for monitoring a processing chamber. In particular, embodiments of the disclosure are directed to methods and apparatus for monitoring the output of a high voltage power supply connected to an electrostatic chuck.

BACKGROUND

Proper chucking of substrates (wafers) is the major concern during wafer processing. During processing, an electrostatic chuck (ESC) holds the wafer in place using high voltage. Changes in the voltage applied by the ESC can cause the wafer to become unseated or move, resulting in poor deposition.

To monitor the wafer chucking, the high voltage output of the ESC inside the pedestal could be monitored for initial or upfront voltage drop and applied voltage degradation detection. Similarly, the raw high voltage output using test stands could be monitored to find output failure/drop if any during component evaluation.

Currently, there is no real time measurement technique to measure the raw high voltage output directly from the ESC power supply. The high voltage output is monitored by analog feedback from ESC power supplies. This feedback measurement does not address any voltage drop during chucking of wafers which may lead to chucking issues.

Accordingly, there is a need for apparatus and methods that provide real-time monitoring of high voltage output.

SUMMARY

One or more embodiments of the disclosure are directed to power management systems. A high voltage power supply has an input and at least one output. At least one electrostatic chuck is connected to the at least one output and a high voltage measurement system comprising at least one high voltage transducer and a controller configured to measure an output from the high voltage transducer.

Additional embodiments of the disclosure are directed to processing methods. At least one electrostatic chuck is powered using an output from a high voltage power supply. The output from the high voltage power supply is converted using a transducer in a high voltage measurement system. The converted voltage from the transducer is measured. An interlock between the high voltage measurement system and the high voltage power supply is operated if the measured converted voltage meets a threshold.

Further embodiments are directed to non-transitory computer readable medium including instructions, that, when executed by a controller of a processing tool, causes the processing tool to perform operations of: measuring an output of a transducer connected to a high voltage power supply; comparing the output to a predetermined threshold value; and operating an interlock between the high voltage power supply and the transducer to turn off the output from the high voltage power supply.

BRIEF DESCRIPTION OF THE DRAWINGS

So that the manner in which the recited features of embodiments of the disclosure can be understood in detail, a more particular description of embodiments of the disclo-

2 sure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
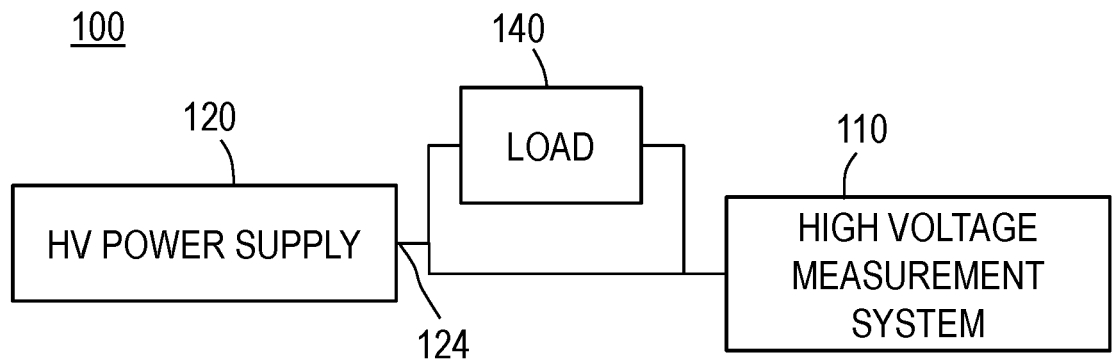
Figure 2:
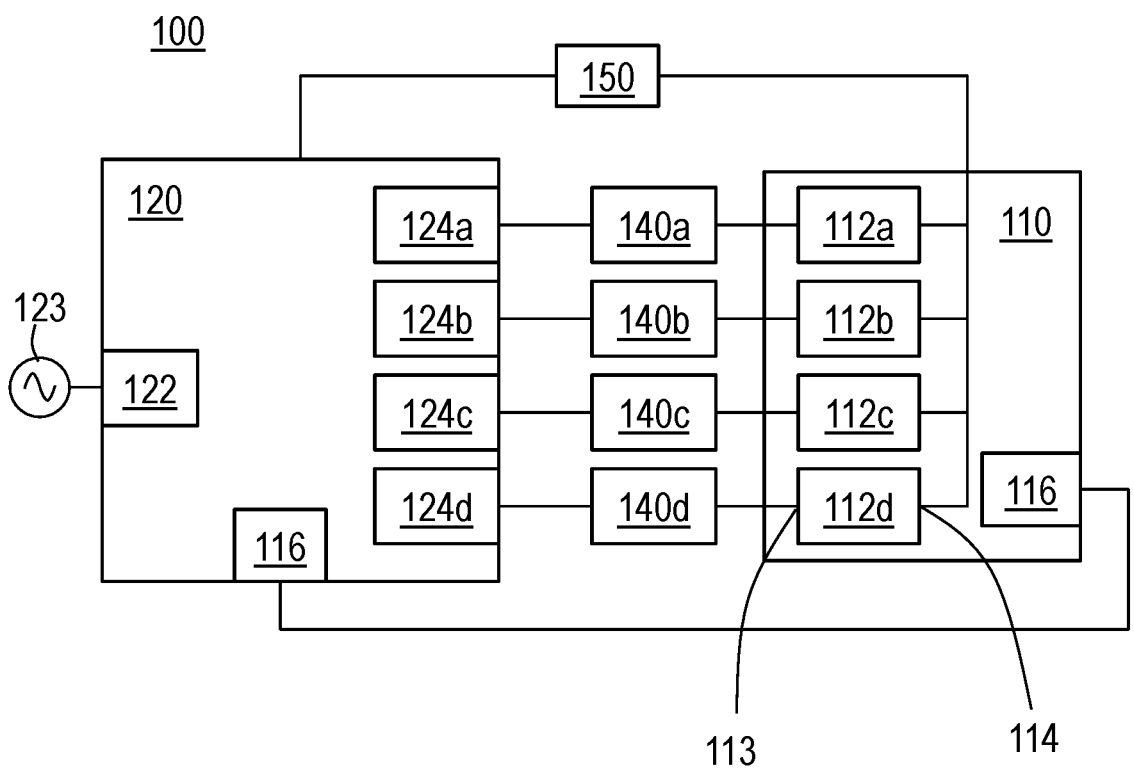

FIG. 1 is a schematic representation of an apparatus with high voltage measurement system according to one or more embodiment of the disclosure; and FIG. 2 is a schematic representation of an apparatus with high voltage measurement system according to one or more embodiment of the disclosure.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon One or more embodiments of the disclosure provide apparatus and/or methods for real-time monitoring of the high voltage output from a high voltage power supply. Some embodiments advantageously enable early detection of voltage drop. For example, in some embodiments, a voltage drop from the high voltage power supply indicates loss of chucking or chucking ability of an electrostatic chuck. Some embodiments advantageously allow for real-time immediate adjustment of the high voltage output. For example, if a voltage drop is in progress, the disclosure allows for adjustment of the output to prevent de-chucking of a substrate.

Some embodiments of the disclosure provide high voltage measurement techniques using voltage transducers to measure high voltage output with high precision accuracy which can be incorporated to process chambers and Test Setups very easily. This enables live monitoring of high voltage output generated from Pedestal ESC inside the process chamber during chuck operation Some embodiments allow for the real-time measurement of pedestal ESC high voltage raw output to measure failures or drops in voltage. Early identification of ESC power supply output failures can be measured, allowing for early intervention, and reducing wafer scraps, improving overall yield, reducing chamber downtime and/or allowing for ESC power supply replacement before major failure.

In some embodiments, a high voltage transducer with +15V & −15V DC Power supply is connected to the high voltage power supply. In an exemplary procedure, a pedestal ESC high voltage power supply output is connected to HV transducer input terminals (HV+, HV−). Apply +15V & −15V DC supply to power terminals of HV transducer. In the exemplary process, the ESC power supply produces high voltage up to +/−2 KV DC based on set voltage to chuck the wafers during the process inside the process chamber. The HV transducer of some embodiments continuously converts the output (2000V:10V ratio) voltage with respect to ESC power supply output from 0-2000V DC. The HV transducer output can be directly monitored online with multimeter or data logger continuously without any safety concerns since it provides maximum output of 10V for equivalent power supply maximum output of 2000V.

Some embodiments advantageously provide a method in which any output deviation or output degradation from the pedestal ESC power supply output can be captured online and can be fixed immediately which will avoid the wafer damage as well as tool down time.

FIG. 1 illustrates a system 100 comprising a high voltage measurement system 110 according to one or more embodiment of the disclosure. The skilled artisan will recognize that measurement system can be part of a process chamber hardware, part of the high voltage power supply, or a separate component, as illustrated.

The system 100 illustrated comprises a high voltage power supply 120, at least one load 140 (e.g., an electrostatic chuck, internal load), and the high voltage measurement system 110. In some embodiments, the high voltage measurement system 110 is connected directly to the high voltage power supply 120, in parallel electrical connection to the load. In some embodiments, the high voltage measurement system 110 is connected to the high voltage power supply through the load 140. The load 140 can be one component or a combination of components that draw power from the high voltage power supply 120.

FIG. 2 illustrates a more detailed embodiment of a system 100. The high voltage power supply 120 includes an input 122 and at least one output 124. As used in this specification, multiple similar components may be numbered with a numeric prefix and a trailing letter. The use of the numeric prefix only, refers to all of the similar components beginning with the numeric prefix. For example, the output 124 of the high voltage power supply 120 refers to output 124a, output 124b, output 124c and output 124d unless otherwise indicated. The illustrated embodiment includes four outputs 124 labeled a-d. However, this is merely representative of one possible configuration and should not be taken as limiting the scope of the disclosure. In some embodiments, the high voltage power supply 120 has more or less than four outputs 124. In some embodiments, there are in the range of two to eight outputs 124.

The input 122 of the high voltage power supply 120 of some embodiments is connected to a high voltage source 123. The high voltage source 123 can be any suitable source known to the skilled artisan. In some embodiments, the high voltage source 123 provides voltage at the input 122 in the range of 50 V to 500 V.

The high voltage power supply 120 converts the alternating current AC input voltage to a high voltage direct current DC voltage. In some embodiments, the high voltage power supply 120 provides an output power in the range of 0 V to ±2000 V. The skilled artisan will understand that the output from the high voltage power supply 120 includes two power lines in which the electrical potential difference is in the range of 0 V to ±2000 V. The skilled artisan will be familiar with high voltage power supplies and handling high voltage DC power.

In some embodiments, the load 140 comprises at least one electrostatic chuck ESC 140a. The electrostatic chuck 140a is connected to the at least one output 124a of the high voltage power supply 120. In the embodiment illustrated in FIG. 2, there are four electrostatic chucks 140a, 140b, 140c, 140d. However, the skilled artisan will recognize that there can be more or less than four loads 140. In some embodiments, there are in the range of 1 to 12 electrostatic chucks.

In some embodiments, there are the same number of electrostatic chucks as outputs on the high voltage power supply.

A high voltage measurement system 110 is connected to the high voltage power supply 120 either directly, or through the electrostatic chuck 140a or other loads 140. The high voltage measurement system 110 includes at least one high voltage transducer 112a. In some embodiments, there are the same number of high voltage transducers 112 as outputs 124 on the high voltage power supply 120. In some embodiments, there are more high voltage transducers 112 than outputs 124. In some embodiments, there are the same number of high voltage transducers 112 as loads 140. In some embodiments, there are more high voltage transducers 112 than loads 140. In some embodiments, the at least one transducer 112 of the high voltage measurement system 110 is connected in parallel to the at least one electrostatic chuck (load 140).

The high voltage measurement system 110 includes a controller 150 that is configured to measure an output from the high voltage transducer 112. In some embodiments, the controller 150 is connected to the transducer 112 and is configured to measure one or more of voltage or current from the output 114. In the illustrated embodiment, the controller 150 is outside of the high voltage measurement system 110. However, this is a schematic arrangement that is merely representative of one possible configuration. In some embodiments, the controller 150 is internal to the high voltage measurement system 110. The controller 150 can be a single control system or a combination of control systems. For example, the controller 150 of some embodiments comprises internal circuitry in the high voltage measurement system 110 that work with an external computer system.

The controller 150 can be any suitable component that can control the high voltage power supply 120 and/or the high voltage measurement system 110. For example, the controller 150 can be a computer including a central processing unit (CPU), memory, inputs/outputs (I/O), and support circuits. The controller 150 may control the system 100 directly, or via computers (or controllers) associated with particular processes and/or support system components.

In one or more embodiments, the controller 150 may be one of any form of general-purpose computer processor that can be used in an industrial setting for controlling various chambers and sub-processors. The memory or computer readable medium of the controller may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory can retain an instruction set that is operable by the processor (CPU) to control parameters and components of the system.

The support circuits are coupled to the CPU for supporting the processor in a conventional manner. These circuits include cache, power supplies, clock circuits, input/output circuitry and subsystems, and the like. One or more processes may be stored in the memory as software routine that, when executed or invoked by the processor, causes the processor to control the operation of the system 100 or individual components in the manner described herein. The software routine may also be stored and/or executed by a second CPU (not shown) that is remotely located from the hardware being controlled by the CPU.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific-purpose computer (controller) that controls the chamber operation such that the processes are performed.

In some embodiments, the controller 150 has one or more configurations to execute individual processes or sub-processes to perform the method. The controller 150 can be connected to and configured to operate intermediate components to perform the functions of the methods. In some embodiments, the controller 150 is connected to and configured to control one or more of the high voltage power supply 120 or the high voltage measurement system 110.

The transducers 112 comprise an input 113 and an output 114. The input 113 of the transducers 112 is configured to accept a high voltage from the high voltage power supply 120 and output 114 a low voltage signal correlated to the input voltage. In some embodiments, the high voltage power supply 120 has an output in the range of 0 V to ±2000 V connected to the input 113 of the transducer 112, and the transducer 112 has an output 114 in the range of 0 V to ±50V, or in the range of 0 V to ±40 V, or in the range of 0 V to ±30 V, or in the range of 0 V to ±20 V or in the range of 0 V to ±10 V. In some embodiments, the output 114 of the transducers 112 provide a voltage that correlates with the output 124 of the high voltage power supply 120 with a 0.2% accuracy. Stated differently, the output of the transducer provides a correlated value to the output of the high voltage power supply that is within 0.2% relative to the actual high voltage signal. In some embodiments, the transducer 112 provides an output voltage in the range of 0% to 2.5%, or 0% to 2%, or 1.5%, or 0% to 1%, or 0% to 0.5% of the voltage at the input.

In some embodiments, controller 150 is operatively connected to an interlock 116 with the high voltage power supply 120. In some embodiments, the controller 150 of some embodiments is configured to turn off the high voltage power supply 120 through the interlock 116 when a decrease in voltage greater than a threshold value is measured from the transducer 112. For example, a controller expecting to receive a reading of 10V from the transducer 112a, receives instead a value of 5 V. If the 5V reading is different from the expected value (e.g., 10V) by a threshold amount (e.g., 1%), then controller 150 can disable high voltage power supply 120 through the interlock 116. In some embodiments, the controller 150 is configured to adjust the high voltage power supply 120 to bring the measured value into the expected range and maintain the chucking of a wafer.

Some embodiments of the disclosure are directed to methods for the live measurement of voltage from a high voltage power supply. A load is powered using the high voltage power supply. For example, an ESC is connected to the output of the high voltage power supply.

The voltage from the output of the high voltage power supply is converted using a transducer in a high voltage measurement system. The measured converted voltage of some embodiments is logged in a system database. An interlock between the high voltage measurement system and the high voltage power supply is operated or suitably controlled if the measured converted voltage meets a threshold value to disable the high voltage power supply.

Additional embodiments of the disclosure are directed to non-transitory computer readable medium including instructions, that, when executed by a controller of a processing tool, causes the processing tool to perform operations of: measuring an output of a transducer connected to a high voltage power supply; comparing the output to a predetermined threshold value; and operating an interlock between the high voltage power supply and the transducer to turn off the output from the high voltage power supply. In some embodiments, the non-transitory computer readable medium further includes instructions, that, when executed by the controller, causes the processing tool to perform operation of powering at least one electrostatic chuck using an output from the high voltage power supply.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A power management system comprising:
a high voltage power supply having an input and at least one output;
at least one electrostatic chuck connected to the at least one output; and
a high voltage measurement system comprising a controller connected to at least one high voltage transducer and operatively connected to an interlock with the high voltage power supply, the controller configured to measure an output from the high voltage transducer and to turn off the high voltage power supply through the interlock when a decrease in voltage greater than a threshold value is measured from the transducer.

2. The system of claim 1, wherein the input of the high voltage power supply is connected to an input voltage source in the range of 50 V to 500 V.

3. The system of claim 2, wherein the output of the high voltage power supply is in the range of 0 V to ±2000V.

4. The system of claim 1, wherein the high voltage power supply has in the range of one to eight outputs.

5. The system of claim 1, wherein there are the same number of electrostatic chucks as outputs to the high voltage power supply.

6. The system of claim 1, wherein the at least one transducer of the high voltage measurement system is connected in parallel to the at least one electrostatic chuck.

7. The system of claim 6, wherein there are the same number of transducers as high voltage power supply outputs.

8. The system of claim 1, wherein the transducer has an input and an output and the transducer provides an output voltage in the range of 0% to 2.5% of the voltage at the input.

9. The system of claim 8, wherein the high voltage power supply has an output in the range of 0 V to ±2000 V and the transducer has an output in the range of 0 V to 10 V with a 0.2% accuracy.

10. A processing method comprising:
powering at least one electrostatic chuck using an output from a high voltage power supply;
converting the output of the high voltage power supply using a transducer in a high voltage measurement system;
measuring the converted voltage from the transducer; and
operating an interlock between the high voltage measurement system and the high voltage power supply with a controller if the measured converted voltage decreases greater than a threshold value.

11. The processing method of claim 10, wherein there are more than one electrostatic chuck connected to the high voltage power supply.

12. The processing method of claim 11, wherein each electrostatic chuck is connected to a different output from the high voltage power supply.

13. The processing method of claim 12, wherein each output of the high voltage power supply is connected to a different transducer.

14. The processing method of claim 10, wherein the high voltage measurement system is connected in parallel to the electrostatic chuck.

15. The processing method of claim 10, wherein the high voltage measurement system comprises a controller configured to measure the output of the transducer, compare the output of the transducer to a predetermined threshold and operate the interlock if the output of the transducer exceeds the predetermined threshold.

16. A non-transitory computer readable medium including instructions, that, when executed by a controller of a processing tool, causes the processing tool to perform operations of:
measuring an output of a transducer connected to a high voltage power supply;
comparing the output to a predetermined threshold value; and
operating an interlock between the high voltage power supply and the transducer with a controller to turn off the output from the high voltage power supply when a decrease in voltage greater than a threshold is measured.

17. The non-transitory computer readable medium of claim 16, further including instructions, that, when executed by a controller of a processing tool, causes the processing tool to perform operation of powering at least one electrostatic chuck using an output from the high voltage power supply.

* * * * *